US005648942A

United States Patent [19]

Kunkel, III

[11] Patent Number: 5,648,942

[45] Date of Patent: Jul. 15, 1997

[54] ACOUSTIC BACKING WITH INTEGRAL CONDUCTORS FOR AN ULTRASONIC TRANSDUCER

[75] Inventor: Harry A. Kunkel, III, State College, Pa.

[73] Assignee: Advanced Technology Laboratories, Inc., Bothell, Wash.

[21] Appl. No.: 542,582

[22] Filed: Oct. 13, 1995

[51] Int. Cl.[6] .......... H04R 17/00; H01L 41/00

[52] U.S. Cl. .......... 367/176; 367/162; 310/327

[58] Field of Search .......... 367/162, 176; 310/327; 29/25.35

[56] References Cited

U.S. PATENT DOCUMENTS

| | | | |
|---|---|---|---|
| 2,415,832 | 2/1947 | Mason | 367/176 |
| 2,881,336 | 4/1959 | Elion | 310/327 |
| 3,995,179 | 11/1976 | Flournoy et al. | 367/162 |
| 4,616,152 | 10/1986 | Saito et al. | 310/327 |
| 4,747,192 | 5/1988 | Rokurota | 29/25.35 |
| 4,751,420 | 6/1988 | Gebhardt et al. | 310/327 |
| 4,894,895 | 1/1990 | Rokurohta et al. | 29/25.35 |
| 4,962,332 | 10/1990 | Rokurohta et al. | 73/632 |
| 5,065,068 | 11/1991 | Oakley | 310/357 |
| 5,267,221 | 11/1993 | Miller et al. | 367/140 |
| 5,297,553 | 3/1994 | Sliwa, Jr. et al. | 25/25.35 |
| 5,329,498 | 7/1994 | Greenstein | 367/155 |

*Primary Examiner*—Ian J. Lobo
*Attorney, Agent, or Firm*—W. Brinton Yorks, Jr.

[57] ABSTRACT

A two phase composite acoustic backing for an ultrasonic transducer array is formed of a first composite material which is electrically conductive and relatively attenuative to acoustic energy and forms a plurality of isolated conductive paths between individual elements of the array and the back side of said backing. The isolated conductive paths are surrounded by an acoustic kerf filler material which is non-conductive and is either attenuative to acoustic energy, exhibits a low acoustic impedance, or both. The resulting two phase composite acoustic backing thus attenuates ultrasonic energy which enters the backing from the transducer elements, both in the conductive paths and in the surrounding kerf filler material, while affording points of electrical attachment to cable wires for the array which are removed from the piezoelectric material.

16 Claims, 5 Drawing Sheets

ACOUSTIC BACKING WITH INTEGRAL CONDUCTORS FOR AN ULTRASONIC TRANSDUCER

This invention relates to ultrasonic transducers, and in particular to an acoustic backing for multi-element ultrasonic transducers which contains integral conductors for the transducer elements.

An ultrasonic transducer probe is used by an ultrasound system as the means of transmitting acoustic energy into the subject being examined, and receiving acoustic echoes returning from the subject which are converted into electrical signals for processing and display. Transducer probes may use either single element or multi-element piezoelectric components as the sound transmission and/or reception devices. A multi-element ultrasonic transducer array is generally formed from a bar or block of piezoelectric material, either a ceramic or a polymer. The bar or block is cut or diced into one or more rows of individual elements to form the array. The element-to-element spacing is known as the "pitch" of the array and the spaces between individual elements are known as "kerfs." The kerfs may be filled with some material, generally a damping material having low acoustic impedance that blocks and absorbs the transmission of vibrations between adjoining elements, or they may be air-filled. The array of elements may be left in a linear configuration in which all of the elements are in a single plane, or the array may be bent or curved for use as a convex or concave array.

Before the piezoelectric material is diced it is generally plated with metallic electrode material on the top (also referred to as the front, or transmit/receive side) and bottom of the block. As the block is diced into individual elements the metal plating is simultaneously cut into individual electrically separate electrodes for the transducer elements. The electrodes on the top of the elements are conventionally connected to an electrical reference potential or ground, and individual wires are attached to the separate electrodes on the bottom of the elements to individually control and process the signals from each element. These wires are conventionally potted in an acoustic backing material which fills the space below the transducer elements and between the wires, and damps acoustic vibrations emanating from the bottom of the transducer array. Alternately, the wires and backing material may be preformed in a block of backing material containing parallel spaced wires which is adhesively attached to the piezoelectric material as described in U.S. Pat. No. 5,329,498. The piezoelectric material and electrodes are then diced while attached to the block of backing material, which retains the individual elements in place as they are separated during the dicing process.

However, the presence of the wires in the backing material can result in adverse acoustic effects. The acoustic vibrations of the piezoelectric material are transferred into the wire conductors, creating undesirable modes of vibration in the wire, which can reflect back into the piezoelectric material and interfere with the desired vibrational mode. Crosstalk between elements can occur through the traditional homogeneous backing surrounding the wires. Furthermore, in the case where the wires are soldered to the transducer element electrodes, the heat of soldering can damage or depole the piezoelectric material or disbond the electrode from the transducer element.

An approach which eliminates the presence of the wire conductors from the backing material is shown in U.S. Pat. No. 5,402,793, where the transducer conductors are attached to electrodes on the sides of the transducer element. This leaves the back of the element, where the backing is located, free of wires or acoustically disruptive conductors. While this approach works well for a single row of elements, a one dimensional array, it cannot be used with an array of multiple rows of element, referred to as a two dimensional or 2-D array. With the 2-D array only the elements on the periphery of the array can be accessed from the sides; the central elements are entirely surrounded by other elements and can only be accessed from the back. Hence, electrical connection to these elements must be made from the back or bottom of the array. It would be desirable, then, to be able to make electrical connections to a 2-D array which does not present or induce adverse acoustic conditions in the backing material, or present hazards to the piezoelectric and its electrodes.

In accordance with the principles of the present invention, a multi-element ultrasonic transducer is provided having a bi-phasic acoustic backing of two types of materials. A first material is conductive and exhibits a moderate to high acoustic attenuation. Regions of the first material are arranged in alignment with elements of the transducer and are in electrical communication with the elements to serve as conductors between the elements and the conductors of the transducer cable. The second material is nonconductive and exhibits a relatively high acoustic attenuation. The regions of the first material are separated by regions of the second material so as to provide acoustic and electrical isolation between the regions of the first material comprising the transducer element conductors.

In a preferred embodiment the first material exhibits a relatively high acoustic impedance and the second material exhibits a relatively low acoustic impedance. The high acoustic impedance of the first material provides relatively good coupling of acoustic vibrations from the transducer elements into the first material regions of the backing. The low acoustic impedance of the second material minimizes vibrational crosstalk between the transducer element conductors. Thus, acoustic vibrations emanating from the rear of the transducer elements readily couple into the backing and are effectively damped, permitting a rapid ring down of the vibrating elements and enabling broad bandwidth operation of the transducer. The reflection of reverberations back to the transducer from the backing is reduced by the intrinsic attenuative properties of both backing materials.

IN THE DRAWINGS

Construction of an acoustic backing of the present invention begins with a block 10 of a first phase or type of material. This first phase is preferably comprised of a material with relatively high acoustic impedance and moderate to high acoustic attenuation. A suitable material for the first phase is a metal-filled epoxy composite. The metal may be metallic particles such as tungsten, silver, or some other suitable metallic powder. The metallic powder may be blended with the epoxy under pressure to assure uniformity, the desired high impedance, and the proper conductivity. Greater pressure will increase the mass density of the block and will improve conductivity. Depending upon the specific materials used, some experimentation may be necessary, as forming under excessive pressure has been found to result in a loss of attenuative acoustic properties.

Many of the piezoelectric ceramics presently in use in medical ultrasound have impedances in the range of 32–35 MRayl. A typical acoustic backing material may have an impedance in the 3–6 MRayl range. It is desirable for the first phase material to have a relatively high acoustic impedance which approaches or matches that of the piezoelectric, so that there will be an efficient transfer of energy into the material and hence a rapid ring down of the vibrating transducer. In this way, the finished transducer will possess a compact impulse response and be able to transmit and receive a broad range of acoustic frequencies.

Figure 1:
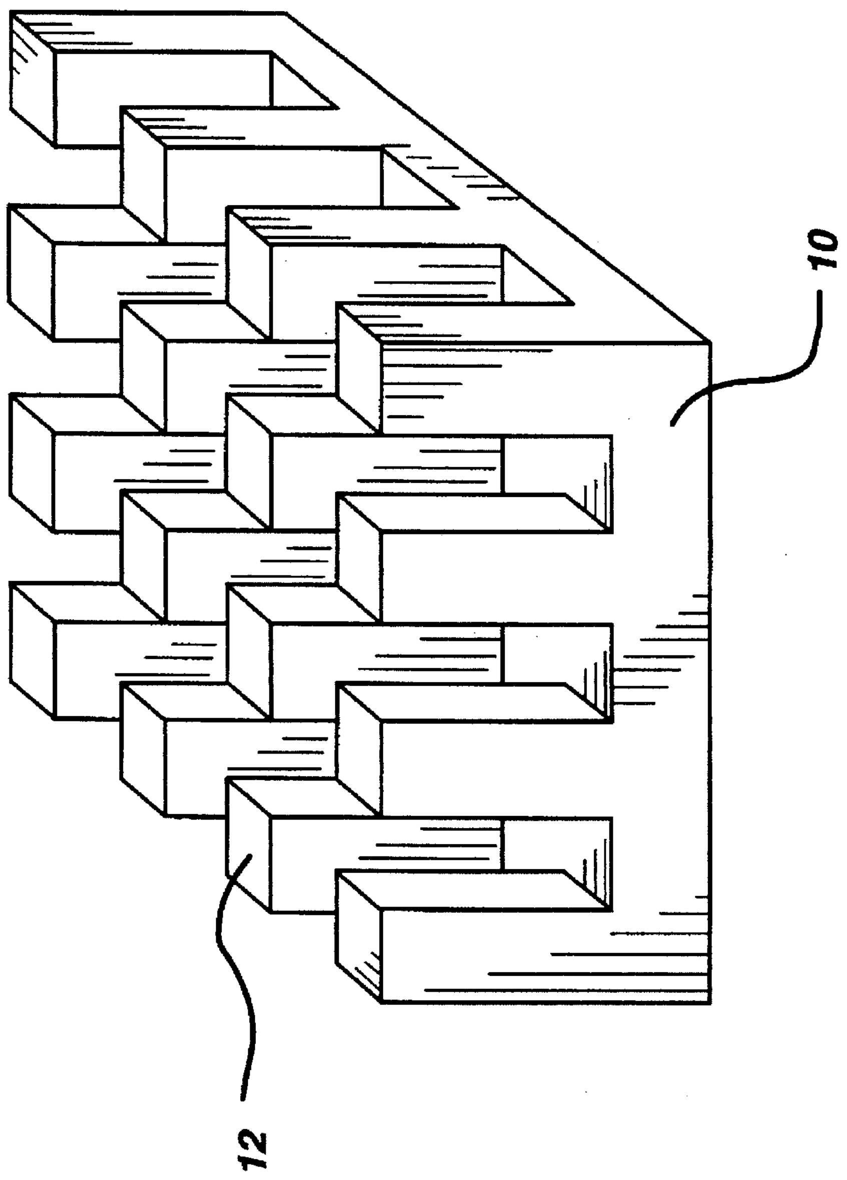
FIG. 1 illustrates a diced block of conductive backing material.

The block 10 of first phase material is diced with a dicing saw to form a number of posts 12 of phase one material, as shown in FIG. 1. These posts 12 will provide electrically conductive pathways between the rear electrodes of a transducer array and the back of the backing.

After the posts have been formed, the spaces remaining between them are filled with phase two material 14. Suitable phase two materials are those exhibiting low acoustic impedance and/or very high acoustic attenuation. A low acoustic impedance affords acoustic isolation between the posts, so that acoustic vibrations present in one post region are not readily coupled to other post regions. A high acoustic attenuation provides rapid and effective damping of vibrations entering the phase two material from the post regions. The kerf material is electrically non-conductive to assure electrical isolation from one post region to another. A suitable phase two material is urethane or epoxy blended with micro-balloons. The phase two material is poured or worked with a squeegee into the kerfs between the posts 12, as shown by the cross-sectional view of FIG. 2. Although this may be done while air is evacuated from the kerfs, such evacuation is not strictly necessary, as any residual air in the kerfs will improve isolation between the posts 12.

If desired, the conductivity of the posts 12 can be improved further by sputtering the post surfaces with nickel or another conductive metal, as indicated by surface 16.

Figure 2:
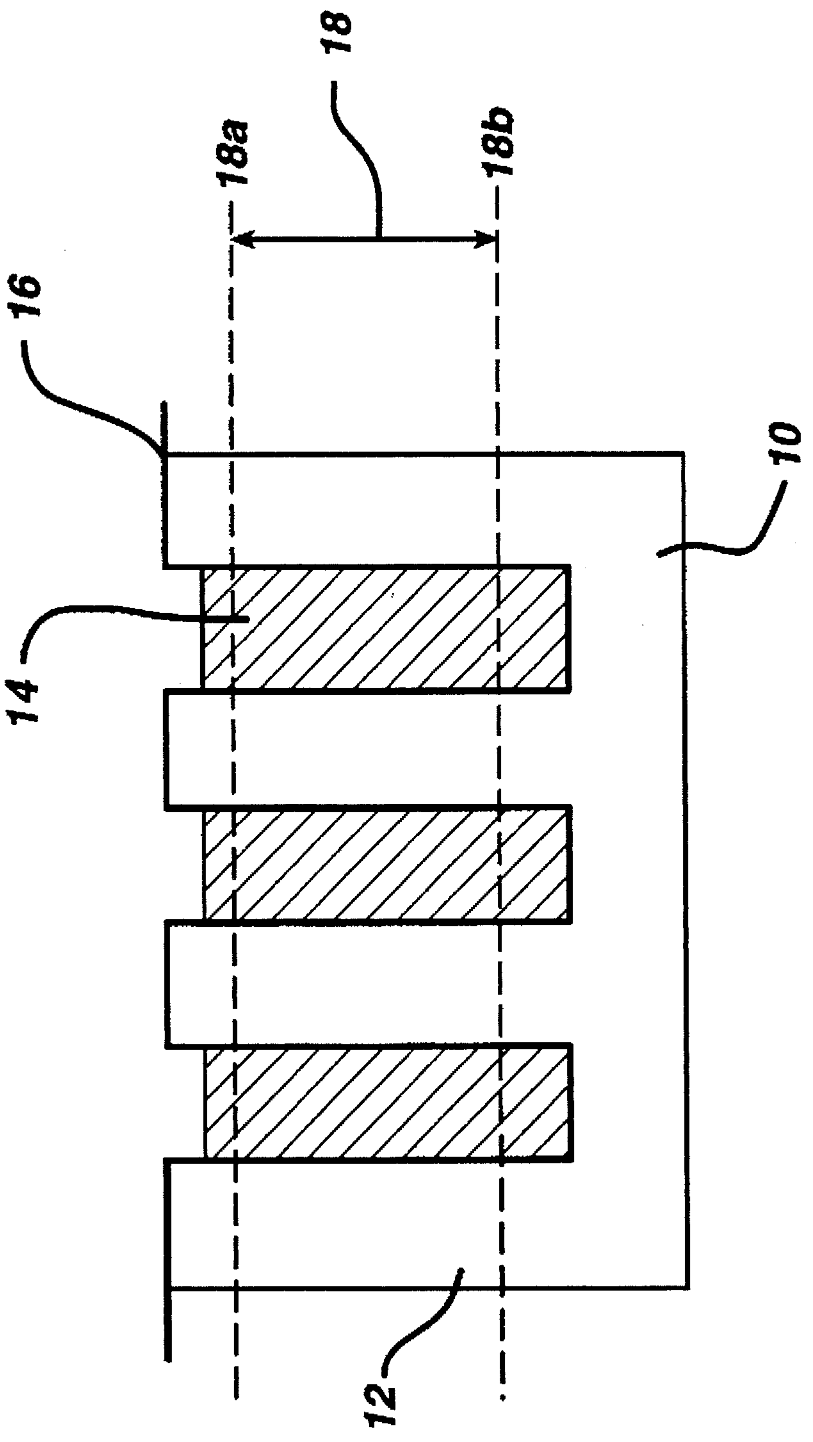
FIG. 2 is a cross sectional view of the block of FIG. 1 in which the kerfs have been filled with an attenuative backing material.
Figure 3:
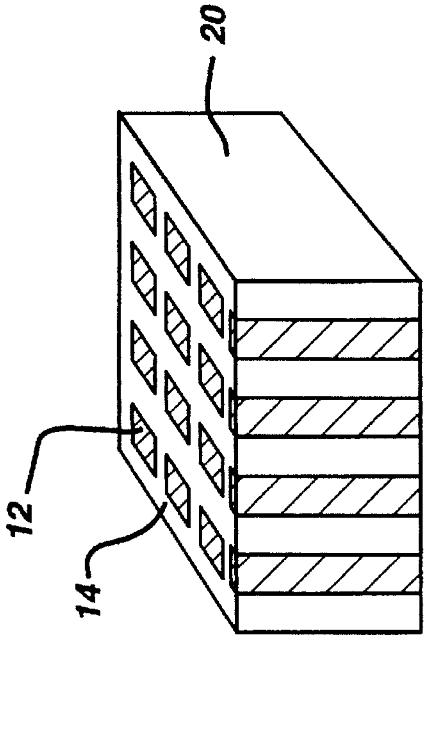
FIG. 3 illustrates a finished acoustic backing, constructed in accordance with the principles of the present invention, for a two dimensional transducer array.

After the kerf filler has cured, the top of the backing is ground or lapped down to its finished front surface level 18*a* as shown in FIG. 2. The back is similarly ground off until the continuous conductive backing is removed, as shown by the final back surface level 18*b* of the backing. The final backing 20 now appears as shown in FIG. 3, in which posts 12 of the conductive phase one material are surrounded by the highly attenuative kerf filler material 14.

To finish the transducer array, a stack comprising a slab of ceramic which has metal electrodes formed on its front (transmitting) and rear (backing contacting) sides, and, if desired, an electrically conductive inner acoustic matching layer formed on the front side of the ceramic, is bonded to the backing with conductive adhesive, with the posts 12 in registration with the desired positions of the transducer elements. A suitable material for the inner acoustic matching layer is silver-filled epoxy, for instance. A dicing saw is used to dice the stack into individual transducer elements by cutting through the matching layer, the ceramic and electrodes and conductive adhesive, and slightly into the kerf filler of the backing. After the elements have been diced, the new kerfs formed in the ceramic and matching layer are filled with kerf filler, or left air-filled if desired. The front surface of the matching layer is faced off to a finished surface, and sputtered with a layer of metal which serves to electrically connect all the element front electrodes together. This electrode forms a signal return or ground plane. If air kerf filler has been elected, a thin foil or sputtered film could be bonded to the inner matching layer to serve as the signal return or ground plane. An optional outer matching layer may be subsequently bonded or cast over this electrode.

Electrical connections to the finished array and backing may be made by soldering or attaching wires to the bottom of the posts 12 using conductive adhesive. Alternately, a printed circuit board with through-plated holes at locations in registration with the posts is attached to the bottom of the backing. Wires may then be soldered in the through-plated holes to securely make electrical connection to the posts and transducer elements. Signal return, or ground electrical connection is made to the front electrodes of the transducer elements through the conductive matching layer using copper ribbon or tape at the sides of the transducer.

When the printed circuit board with through-plated holes is used, it has been found advantageous to attach the block 10 of conductive phase one material to a metal covered printed circuit board at the outset of processing. The dicing process can then cut completely through the phase one material and the metal covering the printed circuit board, separating the metal into individual electrodes at the bottom of each post 12. The process then proceeds as described above with the filling of the kerfs with phase two material.

Figure 4:
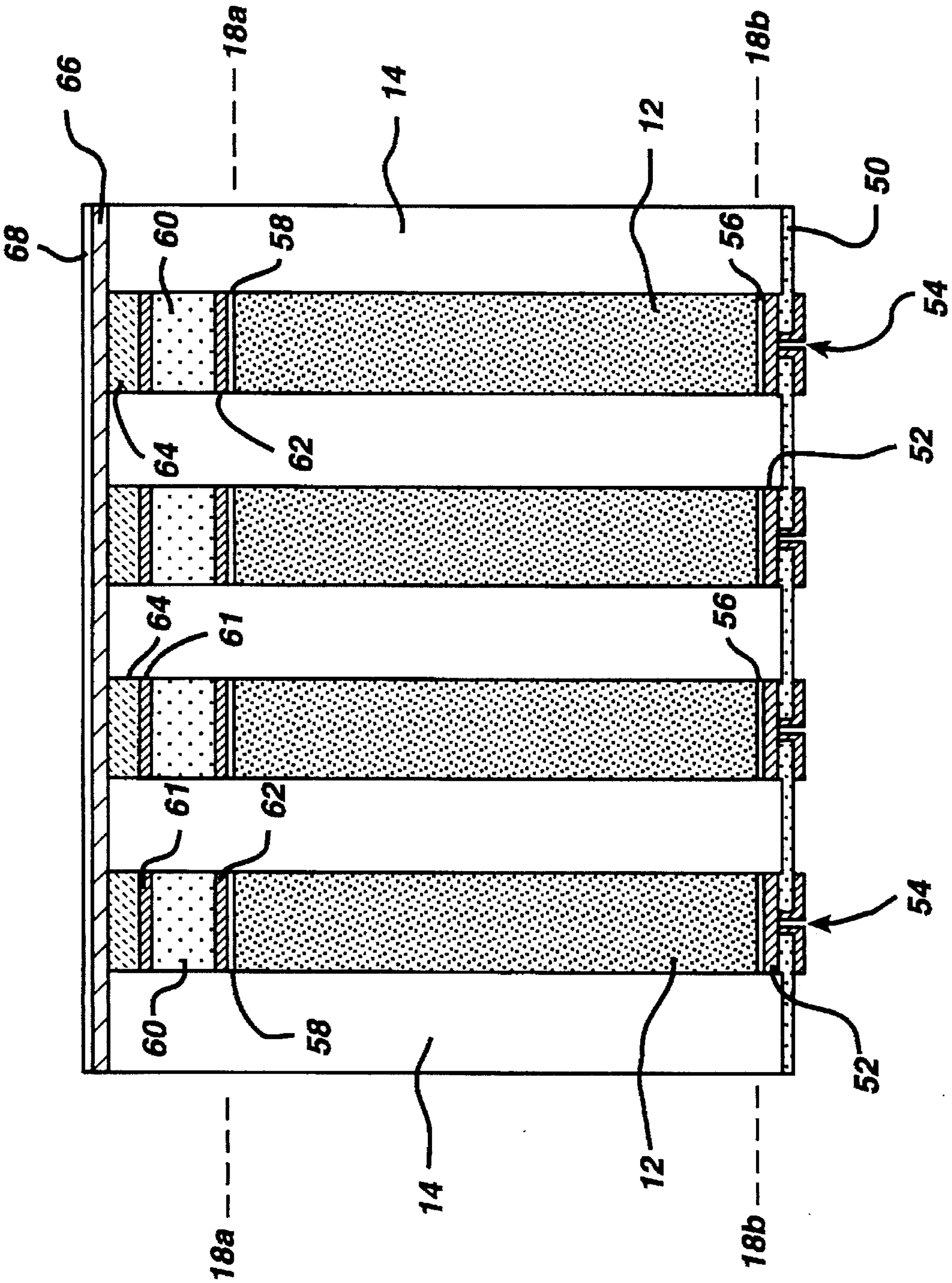
FIG. 4 illustrates in cross section a transducer array, backing, and printed circuit board constructed in accordance with the principles of the present invention.

A cross sectional view of a transducer array fabricated on a biphasic acoustic backing and a printed circuit board is shown in FIG. 4. A block of conductive, highly attentuating composite material is attached to the continuous plated surface 52 of a printed circuit board 50, having through-plated holes 54 at the desired positions and spacings of the transducer elements. These positions and spacing form a registration pattern for fabrication of the array and its backing. The block has top and bottom surfaces delineated by dashed lines 18*a* and 18*b*, respectively. The block is attached to the printed circuit board plating by conductive adhesive 56, or is formed directly on the printed circuit board in a casting process. The block is diced to form separate conductive posts 12 by cutting completely through the block, adhesive, and continuous plated surface of the printed circuit board 50. This dicing separates the plated surface of the board into separate electrode regions 52 as shown in the drawing. The printed circuit board is left partially undiced so as to provide an integral base which holds the structure together. The dicing cuts are then filled with highly attenuating kerf filler material 14 to the top of the backing. This isolates the separate conductive posts 12 with the second phase of highly attenuative material. The top surface of the diced and filled block is machined to form the top surface 18*a* of the finished composite backing.

A bar 60 of piezoelectric ceramic or polymer which is plated on the top and bottom sides with electrode layers 61 and 62, and bonded to an inner acoustic matching layer 64 on the top, is attached to the top of the composite backing with conductive adhesive 58. The piezoelectric material is diced into separate elements 60 in registration with the underlying conductive composite posts 12. The dicing cuts extend through the matching layer 64, piezoelectric 60, electrode surfaces 61 and 62, adhesive 58, and partially into kerfs 14 of the composite backing to completely electrically isolate the separate transducer elements. The kerfs between the elements may then be filled with kerf filler material to the top surface of the inner matching layer 64, which is then finished off to a flat surface. A second electrode 66 of silver or another conductive metal is sputtered over the top surface of the matching layer. An optional outer matching layer 68 may then be bonded to the electrode 66. Wires from a cable may then be attached to the through-plated holes 54 of the printed circuit board to complete the electrical connections to the piezoelectric elements of the array.

Figure 5:
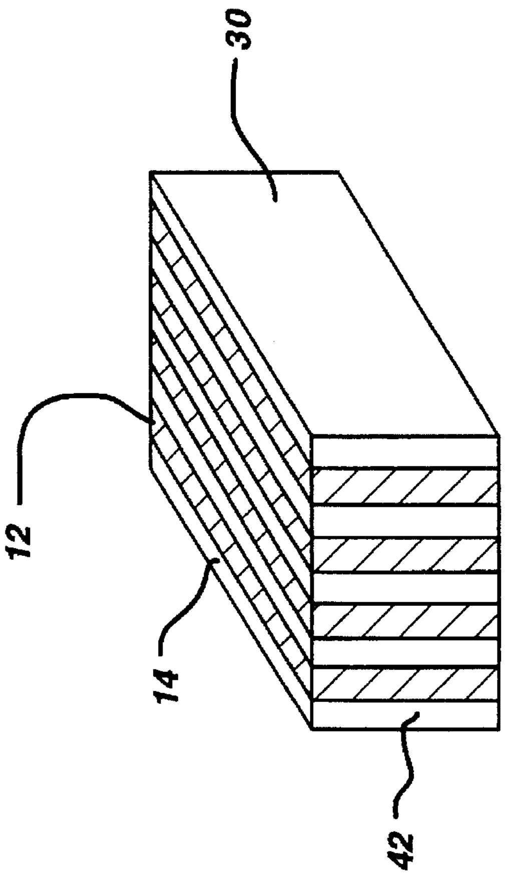
FIG. 5 illustrates a finished acoustic backing, constructed in accordance with the principles of the present invention, for a one dimensional transducer array.

The principles of the present invention may also be used to form a highly attenuative backing for a conventional one dimensional transducer array. Instead of dicing the conductive material in two orthogonal direction, cuts are made in only one direction. These kerfs are filled with kerf filler material 14 and the backing is ground or lapped as described above. A backing 30 which has been fabricated in this manner for a one dimensional array is shown in FIG. 5.

Figure 6:
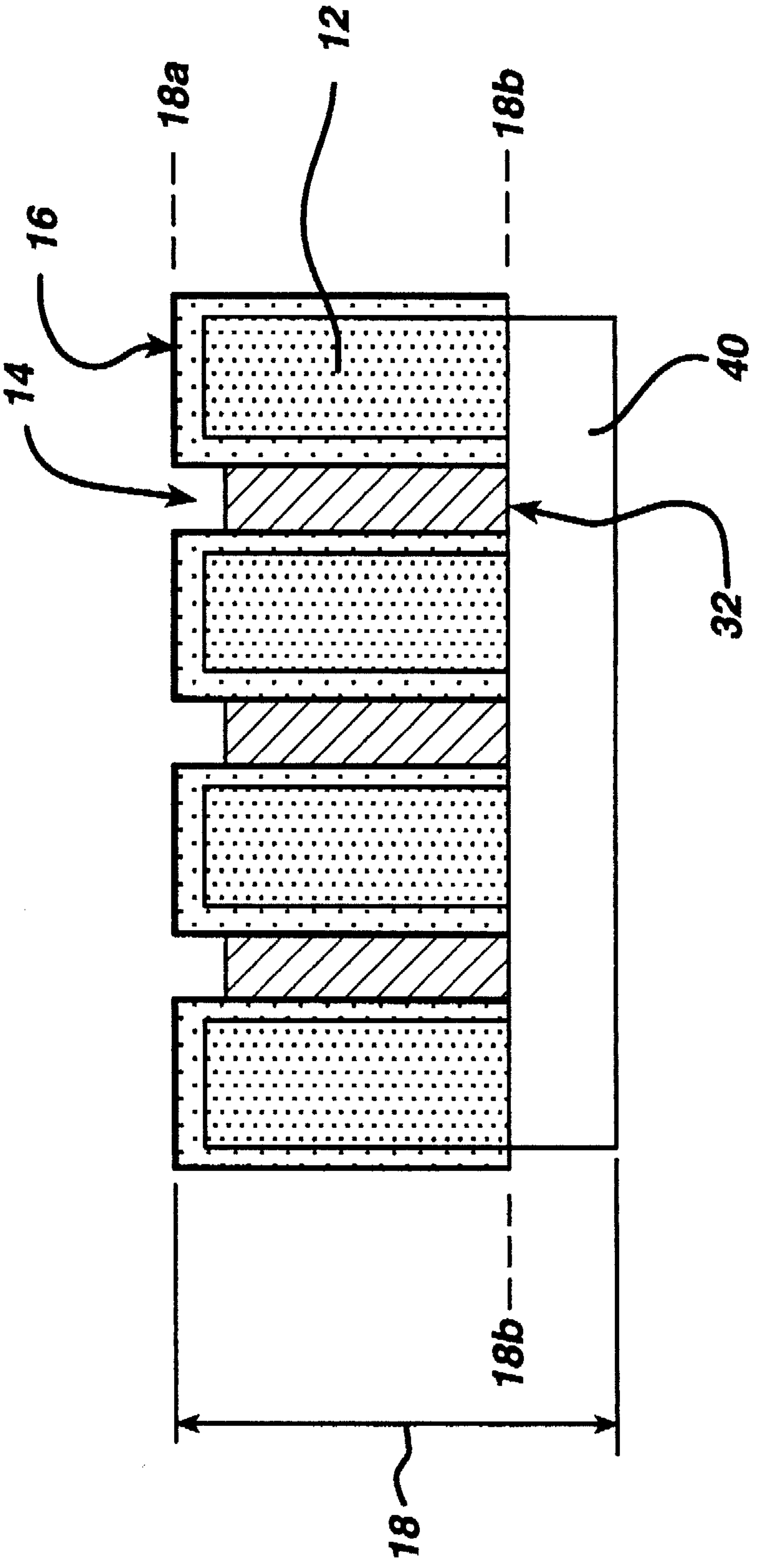
FIG. 6 illustrates in cross section a second embodiment of an acoustic backing for a transducer array constructed in accordance with the principles of the present invention.

A technique for fabricating a composite acoustic backing from a block 40 of non-conductive or poorly conductive composite material, such as a polymer loaded with an oxide power such as aluminum oxide, is shown in FIG. 6. The block 40 is diced partially through to form posts 12 which are separated by kerfs as indicated at 14. The diced block is then completely plated with metallic electrode material as indicated at 16. This electrode material 16 coats both the tops and sides of the posts 12. The kerfs 14 between the plated posts are filled with kerf filler material. The continuous base 40 of the block is then machined away so as to form the surface **18*b* and expose the kerfs 14 to view. This exposed surface 18*b* is then completely plated with a metallic layer 32**.

The piezoelectric is bonded to the surface **18*b* and diced in registration with the posts 12 to create isolated transducer elements with isolated post backings. The dicing extends just deeply enough into kerfs 14 that the metallic layer 32 is separated into isolated electrodes in registration with each element of the piezoelectric. The separate electrodes for each transducer element are thereby connected through platings 32 and 16 to the tops of their respective plated posts 12. Cable connections to the individual electrodes are then made to the plated posts along surface 18*a***.

An attribute of the embodiment of FIG. 6 is that the interior of each post of the backing can have desired acoustic properties of attenuation and impedance obtained without consideration of the conductivity of the post material, as it is not necessary for the posts, absent the electrode material 16, to provide electrical conductivity. Thus, the posts could be formed of a nonconductive material optimized for superior acoustic performance and/or mechanical integrity, without regard for electrical properties. Conductivity is provided by the separate electrode coating 16 of each post 12.

What is claimed is:

1. A composite acoustic backing for an ultrasonic transducer array of piezoelectric elements, comprising:

regions of a first composite material which is electrically conductive and relatively attenuative to acoustic energy, said regions being relatively acoustically and electrically isolated from each other and acoustically and electrically coupled to individual elements of the array to provide electrical paths between said elements and an external surface of said backing; and regions of a second material which is electrically nonconductive and attenuative to acoustic energy, said regions of second material providing acoustic and electrical isolation between said regions of said first composite material.

2. The composite acoustic backing of claim 1, further comprising separate signal connecting electrodes located in registration with terminating surfaces of said regions of said first composite material, wherein said regions of said first composite material are electrically connected to said signal connecting electrodes.

3. The composite acoustic backing of claim 1, wherein said first material comprises a polymeric material loaded with metallic particles, and wherein said second material comprises an acoustic kerf filler material.

4. The composite acoustic backing of claim 3, wherein said metallic particles comprise tungsten or silver particles, and wherein said acoustic kerf filler material comprises an epoxy, a polyurethane, or a silicone rubber compound.

5. The composite acoustic backing of claim 1, wherein said ultrasonic transducer array extends in either one or two dimensions.

6. A composite acoustic backing for an ultrasonic transducer array of piezoelectric elements, comprising:

regions of a first composite material which is electrically conductive, relatively attenuative to acoustic energy, and exhibits a given acoustic impedance, said regions being relatively acoustically and electrically isolated from each other and acoustically and electrically coupled to individual elements of the array to provide electrical paths between said elements and an external surface of said backing; and regions of a second material which is electrically nonconductive and exhibits a low acoustic impedance relative to that of said first composite material, said regions of second material providing acoustic and electrical isolation between said regions of said first composite material.

7. The composite acoustic backing of claim 6, further comprising separate signal connecting electrodes located in registration with terminating surfaces of said regions of said first composite material, wherein said regions of said first composite material are electrically connected to said signal connecting electrodes.

8. The composite acoustic backing of claim 6, wherein said first material comprises a polymeric material loaded with metallic particles, and wherein said second material comprises an acoustic kerf filler material.

9. The composite acoustic backing of claim 8, wherein said metallic particles comprise tungsten or silver particles, and wherein said acoustic kerf filler material comprises a blend of epoxy and micro balloons.

10. The composite acoustic backing of claim 6, wherein said ultrasonic transducer array extends in either one or two dimensions.

11. A composite acoustic backing for an ultrasonic transducer array of piezoelectric elements having a transducer contacting first surface and a signal connecting second surface opposite said first surface comprising:

regions of a first material which is relatively poorly electrically conductive and relatively attenuative to acoustic energy, said regions being relatively acoustically and electrically isolated from each other and extending substantially between said first and second surfaces, each of said regions having an external layer of a relatively highly electrically conductive material extending substantially between said first and second surfaces, said regions being spatially in registration with and acoustically coupled to individual elements of the array such that said layers of conductive material provide electrical paths between said elements and said signal connecting second surface of said backing; and regions of a second, kerf filler material which is electrically non-conductive and attenuative to acoustic energy, said regions of second material providing acoustic and electrical isolation between said layers of conductive material.

12. The composite acoustic backing of claim 11, further comprising separate signal connecting electrodes located on said signal connecting second surface of said backing, wherein said layers of conductive material are electrically connected to said signal connecting electrodes.

13. The composite acoustic backing of claim 11, further comprising a plurality of separate electrodes located on said transducer contacting first surface in registration with said individual elements of said array and electrically connected to said layers of conductive material for making electrical connection between said layers of conductive material and said elements of said array.

14. A composite acoustic backing for an ultrasonic transducer array of piezoelectric elements having a transducer contacting first surface and a signal connecting second surface opposite said first surface comprising:

conductors including central regions of a first material which is electrically non-conductive, relatively attenuative to acoustic energy, and exhibits a given acoustic impedance, said regions being relatively acoustically and electrically isolated from each other and extending substantially between said first and second surfaces, each of said regions having an outer layer of conductive material extending substantially between said first and second surfaces, said conductors being spatially in registration with and acoustically coupled to individual elements of the array such that said layers of conductive material provide electrical paths between said elements and said signal connecting second surface of said backing; and regions of a second material which is electrically non-conductive and exhibits a low acoustic impedance relative to that of said first material, said regions of second material providing acoustic and electrical isolation between said conductors.

15. The composite acoustic backing of claim 14, further comprising separate signal connecting electrodes located on said signal connecting second surface of said backing, wherein said layers of conductive material are electrically connected to said signal connecting electrodes.

16. The composite acoustic backing of claim 14, further comprising a plurality of separate electrodes located on said transducer contacting first surface in registration with said individual elements of said array and electrically connected to said layers of conductive material for making electrical connection between said layers of conductive material and said elements of said array.

* * * * *